United States Patent [19]

Yazawa et al.

[11] 3,945,830

[45] Mar. 23, 1976

[54] DRY PRE-SENSITIZED AZIDE AND SILICONE RUBBER CONTAINING PLANOGRAPHIC PLATES AND METHODS OF PREPARATION

[75] Inventors: Kenichiro Yazawa; Shinzo Kishimoto; Shizuo Miyano; Asaji Kondo, all of Asaki, Japan

[73] Assignee: Fuji Photo Film Co., Ltd., Minami-ashigara, Japan

[22] Filed: Dec. 20, 1973

[21] Appl. No.: 426,751

[30] Foreign Application Priority Data
Dec. 20, 1972 Japan............................ 47-127998

[52] U.S. Cl. .................... 96/75; 96/33; 96/35.1; 96/85; 96/86 P; 96/87 R; 96/91 N; 96/115 R; 101/450; 101/456; 101/457; 101/458; 101/465
[51] Int. Cl.$^2$.... G03C 1/72; G03C 1/54; G03F 7/08
[58] Field of Search........ 96/33, 75, 85, 86 P, 91 N, 96/115 R, 35.1, 87 R; 101/450, 453, 456, 457, 460–467

[56] References Cited
UNITED STATES PATENTS

| | | | |
|---|---|---|---|
| 2,714,066 | 7/1955 | Jewett et al............................. | 96/75 |
| 2,852,379 | 9/1958 | Hepher et al....................... | 96/91 N |
| 2,937,085 | 5/1960 | Seven et al. ......................... | 96/91 N |
| 3,511,178 | 5/1970 | Curtin................................. | 96/33 X |
| 3,520,683 | 7/1970 | Kerwin.................................... | 96/75 |
| 3,549,368 | 12/1970 | Collins et al............................ | 96/75 |
| 3,591,378 | 7/1971 | Altman .............................. | 96/91 N |
| 3,606,922 | 9/1971 | Doggett .............................. | 96/33 X |
| 3,615,538 | 10/1971 | Peters...................................... | 96/75 |
| 3,632,375 | 1/1972 | Gipe .................................. | 96/33 X |
| 3,677,178 | 7/1972 | Gipe .................................. | 96/33 X |
| 3,728,123 | 4/1973 | Gipe .................................. | 96/33 X |
| 3,779,758 | 12/1973 | Polichette .......................... | 96/75 X |

OTHER PUBLICATIONS

Kirk–Othmar, "Ency. of Chem. Tech.," 2nd Ed., Vol. 18, 1969, pp. 221–257.

*Primary Examiner*—Charles L. Bowers, Jr.
*Attorney, Agent, or Firm*—Sughrue, Rothwell, Mion, Zinn & Macpeak

[57] ABSTRACT

A dry presensitized planographic plate composed of a support having coated thereon one or two layers of (a) a silicone rubber, (b) a photosensitive azide compound, (c) a cyclized rubber, and (d) a copolymer of vinylidene chloride and acrylonitrile, the uppermost layer, when the planographic plate has two layers, containing at least the component (a) and (b) and the lower layer containing at least the component (c).

14 Claims, No Drawings

DRY PRE-SENSITIZED AZIDE AND SILICONE RUBBER CONTAINING PLANOGRAPHIC PLATES AND METHODS OF PREPARATION

BACKGROUND OF THE INVENTION

1. Field of the Invention

The present invention relates generally to a presensitized planographic plate which does not require a fountain solution (hereinafter, such a planographic plate is designated a "dry presensitized planographic plate"). More particularly, the invention relates to a dry presensitized planographic plate having coated on a support a layer comprising a photosensitive azide compound and a silicone rubber.

2. Description of the Prior Art

A dry presensitized planographic plate which utilizes the printing ink-repellency of a silicone rubber is known. Such a dry presensitized planographic plate has a layer of a photosensitive material and a layer of silicone rubber as separate layers as described in detail in, for instance, the specifications of U.S. Pat. Nos. 3,677,178 and 3,511,178.

However, such a conventional dry presensitized planographic plate has the following problems:

1. Since the dry presensitized planographic plate has a so-called multi-layer structure composed of a layer of the photosensitive material and a layer of the silicon rubber, it is important to adhere both layers closely and strongly on preparation of the planographic plate.

2. In a type of dry planographic plate in which the uppermost layer is a silicone rubber layer, the uppermost layer is restricted in thickness to permit permeation of a developer through the layer.

3. In a type of dry planographic plate wherein a photosensitive layer is disposed on a silicone rubber layer, a temporary support is additionally required and also the adhesive property of the photosensitive layer to the silicone rubber is not very good.

SUMMARY OF THE INVENTION

Hence, as the result of various investigations of discovering dry presensitized planographic plates not having the above-described difficulties and capable of being produced simply, the inventors have succeeded in providing a new dry presensitized planographic plate having a novel structure in which a photosensitive material and a silicone rubber are present in one layer.

An object of this invention is to provide a new positive-working dry presensitized planographic plate. Namely, a particular object of this invention is to provide a dry presensitized planographic plate having a layer comprising a photosensitive azide compound and a silicone rubber.

Thus, according to the present invention, there is provided a dry presensitized planographic plate having coated on a support one or two layers of (a) a silicone rubber, (b) a photosensitive azide compound, (c) a cyclized rubber, and (d) a copolymer of vinylidene chloride and acrylonitrile, with the uppermost layer, when the planographic plate has two layers of these components, containing at least the component (a) and component (b) and the lower layer containing at least the component (c).

DETAILED DESCRIPTION OF THE INVENTION

An important feature of this invention lies in using a photosensitive azide compound and a silicone rubber in one layer. Another feature of this invention is in the point of using a cyclized rubber as a combination with the photosensitive azide compound and further using a copolymer of vinylidene chloride and acrylonitrile as a combination of these components for increasing the strength of the silicone rubber layer containing the photosensitive material and improving adaptability to development.

Practical examples of the dry presensitized planographic plate of this invention can be prepared in the following manner:

1. A homogeneous solution of a mixture of a silicone gum (a), a photosensitive azide compound (b), a cyclized rubber (c), and a copolymer of vinylidene chloride and acrylonitrile (d) is coated on a support such as an aluminum sheet.

2. A coating composition containing a cyclized rubber (c) and a copolymer of vinylidene chloride and acrylonitrile (d), as a subbing layer, is coated on a support such as an aluminum sheet and then a homogeneous solution of a silicone gum (a) and a photosensitive azide compound (b) is coated on the subbing layer.

3. A coating composition containing a cyclized rubber (c) is coated in a support such as an aluminum sheet and then a homogeneous solution of a mixture of a silicone gum (a), a photosensitive azide compound (b), and a copolymer of vinylidene chloride and acrylonitrile (d) is coated on the subbing layer.

Each material used in this invention will be explained hereinafter in detail.

As the silicone gum, a single package type normal-temperature vulcanization type silicone gum and a two-package type normal-temperature vulcanization type silicone gum can be used in this invention. In the specification the term "silicone gum" is used to designate an unvulcanized polyorganosiloxane and the term "silicone rubber" is used to designate a polyorganosiloxane in the vulcanized state. These silicone gums can be used individually or as a mixture of them.

The single package-type silicone gum includes those having dimethylpolysiloxane chains terminated by acetyl, oxime, alkyl or amino groups. The single package-type silicone gum is a linear compound which has repeating units of the following general structure

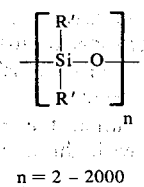

$$\left[ \begin{array}{c} R' \\ | \\ Si-O \\ | \\ R' \end{array} \right]_n$$

n = 2 – 2000

R', which can be the same or different, is a monovalent alkyl or aryl group, or a cyanoaryl group. Generally less than 2 – 3 molar % of the R' groups are vinylphenyl or halovinyl or phenyl, but most usually essentially, R' is a methyl group.

These silicone gums contain the following terminal groups $$(RO)_2-Si-O-$$
$$\phantom{(RO)_2-}R'$$

where R is an alkyl group having 1 to 3 carbon atoms, and R' is as described above;

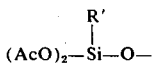

where Ac is an acetyl group and R' is as described above;

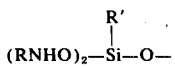

where R is an alkyl group having 1 to 3 carbon atoms and R' is as described above; and

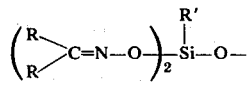

where R is an alkyl group having 1 to 3 carbon atoms and R' is as described above.

The single package type silicone gum becomes a silicone rubber of high molecular weight upon curing by hydrolysis (at the above described terminal groups). Upon hydrolysis, the compounds eliminated are acetic acid, an alcohol, an oxime, etc., depending on the substituent terminal group. Depending upon the released components, the commercially available silicone gums are classified into four types: de-acetic acid-type, de-oxime-type, de-alcohol-type and deamination-type. A de-alcohol type is preferred. The de-acetic acid-type is commercially available as KE-41RTV (RTV is an abbreviation of Room Temperature Vulcanization) and KE-42RTV supplied by Shin-etsu Chemical Industries Co., Ltd., SH-781RTV, SH-9731RTV, SH-9732RTV, SH-9737RTV and SH-9140RTV supplied by Toray-Silicone Co., and TSE-370 (trade name, made by Tokyo Shibaura Electric Co., Ltd.) with these types having the general formula

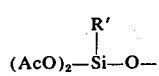

where R is alkyl ($C_1 - C_3$), and Ac is acetyl, the de-oxime-type is commercially available as KE-44RTV and KE-45RTV supplied by Shin-etsu Chemical Industries Co., Ltd. and SH-780-RTV and PRX-305 dispersion supplied by Toray-Silicone Co. these silicone gums having the general formula

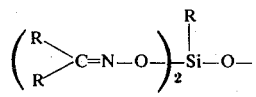

where R is alkyl ($C_1 - C_3$), the de-alcohol-type is commercially available as DC-3140RTV supplied by Dow-Corning Co. and Silaseal E supplied by Fuji Kobunshi Co., Ltd., and the damination-type is commercially available as Elastseal 33, Elastseal 34, Elastseal 50 and Elastseal 59 supplied by Wacker Chemie Co., with these types having the general formula

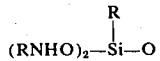

wherein R is alkyl ($C_1 - C_3$),

The two package-type silicone gums are basically of two types: a condensation type and an addition type.

The two package addition reaction type silicone gum generally, arises from the following reaction schematic

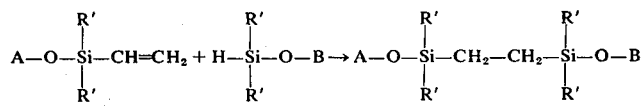

or the following reaction schematic

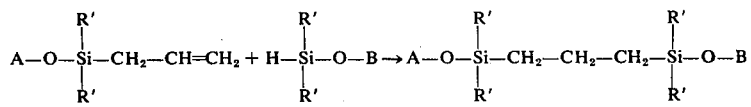

where R' is as described above.

In the above, the symbols A and B have been used to represent the organosiloxane residue bonded to these addition polymerizing type terminal groups. A and B can be the same or different and their composition can vary since the essential characteristic of these organosiloxanes is in the terminal groupings which are addition polymerizable, in which palladium or platinum compounds are used as a catalyst and due to addition polymerization between, the unsaturated groups such as a vinyl group or allyl group and the

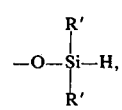

moiety the rubber cures.

Thus, the so called two-package type silicone gum is one in which the catalyst and the siloxane are separate and are mixed when used.

A specific example of the two package addition reaction type silicone gum comprises a mixture, as one component, of an organopolysiloxane having a vinyl group in the molecule and an organohydrogenpolysiloxane, e.g., a mixture of compounds having terminal groups of the following general formula

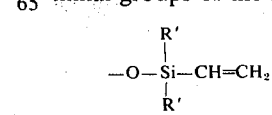

terminal group of polyorganosiloxane

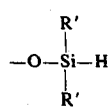

terminal group of organohydrogenpolysiloxane wherein R' is as previously described, and a catalyst, as another component, such as a platinum compound or a palladium compound. $H_2PtCl_6$ is often used as a catalyst. The two components are combined together immediately before use.

The addition type silicone gums commercially available include KE-103RTV, KE-106RTV and KE-1300RTV supplied by Shin-etsu Chemical Industries Co., Ltd., and SH-9555RTV supplied by the Toray-Silicone Co., in which R' is alkyl ($C_1 - C_3$).

The two package type silicone condensation type gums generally give rise to the following reaction schematic

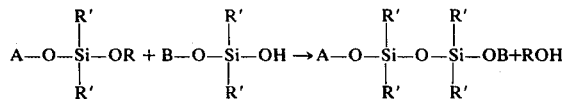

wherein R', R, A and B are as hereinbefore defined, in which the terminal groups which condense can be represented by the following formulas

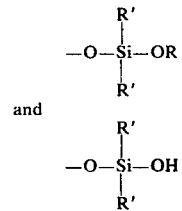

A suitable catalyst component is $SnCl_3$.

The commercially available condensation type silicone rubbers include KE-10RTV, KE-12RTV, KE-15RTV, KE-17RTV, KE-20RTV, KE-102RTV supplied by Shin-etsu Chemical Industries Co. Ltd., and SH-9551RTV, SH-9552RTV, SH-9553RTV and SH-9554RTV supplied by Toray-Silicone Co., in which R' is alkyl $C_1 - C_3$.

Any of the known photosensitive azide compounds having an azide group in the molecule can be used as the photosensitive azide compounds in this invention, with aromatic azides being preferred. Such azide compounds are described in detail in, e.g., M. S. Dinaburg; *Photosensitive Diazo Compounds*, published by The Focal Library, Takahiro Tsunoda, *Kankosei Jushi* (*Photosensitive Resins*), published by Insatsu Gakkai (Printing Society) and J. Kosar, *Light-Sensitive Systems*, pp. 330–336, John Wiley & Sons.

Specific examples of such a photosensitive azide compounds are 2,6-dichloro-4-nitro-azidobenzene, azidophenylamine, 3,3'-dimethoxy-4,4'-diazidodiphenyl, 4'-methoxy-4-azidodiphenylamine, 4,4'-diazidodiphenylamine, 4,4'-diazidodiphenylmethane, 4'-nitrophenylazobenzene-4-azide, 1-azidopyrene, 3,3'-dimethyl-4,4'-diazidodiphenyl, 4,4'-diazidophenylazonaphthalene, p-phenylenebisazide, p-azidobenzophenone, 4,4'-diazidophenylmethane, 4,4'-diazidostilbene, 4,4'-diazidocalcon, 2,6-di-(4'-azidobenzal)cyclohexanone, 2,6-di-(4'-azidobenzal)-4-methylcyclohexanone, etc. These azide compounds can be used alone but it is preferable, when the azide compound is photosensitive in the short wave length region, to spectrally sensitizing the azide compound so that it is photosensitive in the longer wave length side by using a sensitizer such as 1-nitropyrene, 1-ethyl-2-(β-styryl)quinolinium iodide, 1-ethyl-2(p-hydroxyethoxystyryl)quinolinium iodide, 1-methyl-4'-hydroxyethoxystilbazolium methosulfate, 2-(3-sulfobenzoylmethylene)-1-methyl-β-naphthothiazoline and 2-benzoylmethylene-1-methyl-β-naphthothiazoline.

A cyclized rubber is obtained by gradually heating a natural rubber or treating a natural rubber together with an acid catalyst and contains therein units of the following structure:

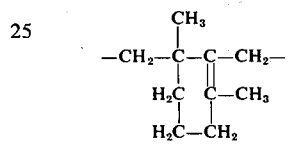

Such cyclised rubber is disclosed in W. J. S. Naunton *The Applied Science of Rubber*, pages 90–98, Edward Arnold Publishers Ltd., London; W.J. Roff et al *Fibres, Films, Plastics and Rubbers*, pages 336–340, Butterworths, London; and examples thereof are described in U.S. Pat. No. 2,852,379.

Cyclized rubbers are commercially available under the trade name of, e.g., Thermolite-S, Thermolite-P, and Thermolite-N (made by the Seiko Chemical Co.), which are produced by cyclizing natural rubber with stannic chloride.

The copolymer of vinylidene chloride and acrylonitrile which can be used in this invention suitably can contain vinylidene chloride and acrylonitrile units in a molar ratio of about 70:30 to 91:9 with a preferred viscosity ranging from about 1 to 7 cps (2% wt solution in dimethylformamide at 25°C) and suitable copolymers are also commercially available under the trade names of Saran resins (produced by the Dow Chemical Company) but of these resins the copolymers in which the molar ratio of the vinylidene chloride to the acrylonitrile in the polymer is about 80 to 20 are particularly preferred in this invention.

Specific examples of such vinylidene chloride-acrylonitrile copolymers are EX-5701 (trade name, made by Asahi Dow Co.) and F-310 and F-220 (trade names, made by Dow Chemical Co.).

As the support for the dry presensitized planographic plates of this invention, metallic sheets such as an aluminum sheet, a zinc sheet, a copper sheet, and an iron sheet can be used. The metallic sheet can be used as it is or after graining. Also, in the case of using an aluminum sheet, it can be subjected to a chemical treatment as disclosed in U.S. Pat. Nos. 2,714,066; 3,280,734; 3,181,461; and 2,882,153 or an anodizing treatment before use. Furthermore, a polyester film or a cellulose acetate film having good dimensional stability can be used as the support in this invention. Still further, the so-called laminate paper, i.e., a paper laminated with a polymer film or an aluminum foil can also be used as the support.

Furthermore, a known agent for improving the adhesive property of the support can be coated on the support as a subbing layer and a silicone primer is such an agent. As the silicone primer, solutions in nonpolar solvents of monomers or substances having a low molecular weight such as carbon functional organic silanes, for example, alkylsilanol, esters thereof, organoalkoxysilane and alkylvinylsilanes, such as Toray Silicone PR X 304, Primer SH506 Surface active agent, and Toshiba Silicone Primer-ME-11 are preferably used.

These silane compounds have organic groups of two kinds of different reactivity, for example:

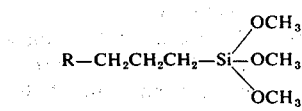

where R can be, for example, an alkyl group, an alkylamino group, an aminoalkyl group, an amino group, an alkoxyaryl group, a methacryloxy group, a glycidioxy group, a cycloalkyl group, and the like. Examples of such are

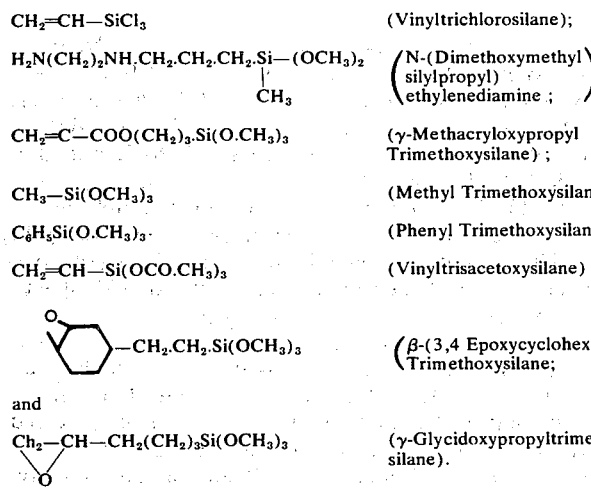

One method of producing the dry presensitized planographic plate of this invention will be explained below. 1 to 5 parts by weight of a solution prepared by dissolving 3 g of a cyclized rubber (c) in 100 ml of an aromatic organic solvent such as toluene, xylene, and benzene, 1 to 5 parts by weight of a photosensitive azide compound (b), 1 to 2 parts by weight of a copolymer of vinylidene chloride and acrylonitrile (d), and 10 to 30 parts by weight of a silicone gum (a) (in the case of using a two-liquid normal-temperature vulcanization silicone gum, it is required to use a vulcanization catalyst for this silicone rubber in an amount of 5 to 20% by weight of the silicone gum) are dissolved uniformly in 200 to 400 parts by weight of a mixture of methyl ethyl ketone, toluene, and chlorobenzene in a 1:1:1 volume ratio. The solution thus prepared is uniformly coated on an aluminum sheet subjected to a chemical conversion treatment with sodium silicate in a rate of 3 to 10 g/1000 cm², preferably 5 to 8 g/1000 cm², and heated for 1 minute at 120°C to vulcanize the silicone gum into a solvent-insoluble silicone rubber, whereby a dry presensitized planographic plate of this invention is obtained. Suitable heating times can range from about 90° to 150°C, preferably 110° to 120°C, for 1 to 10 minutes, more generally 2 to 5 minutes.

A further embodiment of the method of preparing the two-layer type dry presensitized planographic plate of this invention will now be described. A mixture of 90 to 95 parts by weight of a solution prepared by dissolving 2.5 g of a cyclized rubber (c) in 100 ml of a solvent mixture of methyl ethyl ketone and toluene in a 1:3 volume ratio and 10 to 5 parts by weight of a solution prepared by dissolving 2.5 g of a copolymer of vinylidene chloride and acrylonitrile (d) in a solvent mixture of methyl ethyl ketone and toluene in a 1:3 volume ratio is coated uniformly on an aluminum sheet subjected to a chemical conversion treatment with sodium silicate in an amount of 1 to 4 g/1000 cm² and dried to remove solvent.

On the other hand, 2 to 5 parts by weight of a photosensitive azide compound (b), 2 to 10 parts by weight of a one-liquid normal-temperature vulcanization type silicone gum (a), and 15 to 30 parts by weight of a two-liquid normal-temperature vulcanization type silicone gum (together with a catalyst for this in an amount of 5 to 20% by weight of the silicone gum) were uniformly dissolved in 300 to 400 parts by weight of a solvent mixture of methyl ethyl ketone and cyclohexanone in a 6:1 volume ratio. The solution thus prepared was coated on the subbing layer formed on the aluminum sheet in the above-described procedure in an amount of 3 to 10 g/1000 cm², preferably 5 to 8 g/1000 cm², and heated for 1 minute at 120°C to provide the dry presensitized planographic plate of this invention. Suitable heating times and temperatures are as previously disclosed.

Furthermore, when the same procedure as described above is conducted using the solution of the photosensitive azide material (a) and the silicone gums (b) containing further 1 to 3 parts by weight of a copolymer of vinylidene chloride and acrylonitrile (d), a more excellent dry presensitized planographic plate of this invention can be obtained.

When the dry presensitized planographic plate of this invention as prepared in the above described process is exposed, e.g., using light ranging from 360 to 410 nm, through a positive film for making a printing plate, the azide compound at the exposed areas is decomposed into nitrene, which reacts with the double bond portion of the cyclized rubber to form a cross-linked structure, which results in insolubilizing the portions insoluble in a developer. On the other hand, the areas of the presensitized planographic plate which were not exposed to light cause no chemical change or modification and thus if such portions are treated with an appropriate developer, these portions dissolved off to expose the surface of the aluminum to provide image portions. When the printing plate thus prepared is inked, only the exposed aluminum surface or the image portions are inked.

As the developer for the dry presensitized planographic plate of this invention, a developer for Photo Resist KTFR, made by Eastman Kodak Co. or a hydrocarbon compound, preferably containing 5 to 9 carbon atoms, such as n-heptane can be used. In this case, since the n-heptane has high volatility, it may be used as a mixture thereof with a liquid paraffin (suitable liquid paraffins being disclosed in JIS K 2231-1957) in an amount by volume of 10:1 to 1:2, preferably 3:1 to 1:1 of hexane to liquid paraffin.

Moreover, a creamy dispersion prepared by mixing gasoline with aqueous alkali metal salt of a fatty acid solution, e.g., 1 part by weight salt, 2 to 5 parts by weight water and 3 to 6 parts by weight gasoline) can be used as the developer for the dry presensitized planographic plate of this invention with good facility in handling.

Features of the dry presensitized planographic plate of this invention are as follows:

1. The photosensitive material is present together with the silicone rubber in a same layer in a dispersed state in the silicone rubber, which can provide sharp prints having high resolving power.
2. An azide compound is used as the photosensitive material and in this case a cyclized rubber is used in combination with the azide compound. The cyclized rubber is used in the form of a mixture with the silicone rubber or in the form of a subbing layer which is separately formed on the support from the layer of the silicone rubber and the photosensitive azide compound.
3. A copolymer of vinylidene chloride and acrylonitrile is also used, which improves the adaptability to development and also increases the strength of the layer of the silicone rubber.
4. The dry presensitized planographic plate of this invention can be produced at low cost.

Now, the invention will be explained more specifically by reference to the following examples. Unless otherwise indicated, all parts, percents and ratios, etc. are by weight.

EXAMPLE 1

0.5 g of a solution prepared by dissolving 3 g of a cyclized rubber, Thermolite-S (trade name, made by the Seiko Chemical Co.), 0.1 g of 2,6-bis-(4'-azidobenzal)cyclohexanone (made by the Daito Chemical Co.), 0.1 g of a Saran resin, EX-5701 (80:20 VC/ACN molar ratio viscosity 2.4 cps, trade name, made by the Asahi Dow Co.), 2 g of a two-liquid normal-temperature vulcanization type silicone gum, SH-9555 RTV (trade name, made by the Toray Silicone Co.), and 0.15 g of a silicone vulcanization catalyst RG (made by the Shinetsu Chemical Industry Co.) were dissolved in 30 ml of a mixed solvent of methyl ethyl ketone, toluene, and chlorobenzene in a 1:1:1 volume ratio to provide a photosensitive composition. The coating composition thus prepared was coated uniformly on an aluminum plate treated with sodium silicate in an amount of 6 g/1000 cm$^2$ and then immediately heated for 1 minute to 120°C to provide a dry presensitized planographic plate of this invention.

After one month from the preparation, the dry presensitized planographic plate thus prepared was exposed for 2 minutes through a positive film using a Plano PS-A-3 Printer (made by the Fuji Photo Film Co.) and developed with n-heptane, whereby the silicone rubber layer at the image areas was removed to expose the aluminum surface. When the printing plate was mounted and run on an offset printing machine from which the fountain solution supply means had been removed using as a printing ink "Speed King Black Ink" (made by the Toyo Ink Co.), good prints were obtained. After printing 500 prints, no scratches were found on the printing plate.

EXAMPLE 2

90 g of a solution prepared by dissolving 2.5 g of Thermolite S in 100 ml of a solvent mixture of methyl ethyl ketone and toluene in a 1:3 by volume ratio was mixed with 10 g of a solution prepared by dissolving 2.5 g of a Saran resin EX-5701 (trade name, made by the Asahi Dow Co.) in 100 ml of a solvent mixture of methyl ethyl ketone and toluene in a 7:14 by volume ratio to provide a coating composition for the subbing layer. The coating composition thus prepared was coated on an aluminum sheet in a thickness of about 1 micron and dried.

A photosensitive composition was prepared by dissolving 0.2 g of 2,6-bis-(4'-azidobenzal)-cyclohexanone, 0.5 g of a one-liquid normal-temperature vulcanization type silicone gum, KE-41 (trade name, made by the Shinetsu Chemical Industry Co.), 2 g of a two-liquid normal-temperature vulcanization type silicone gum, SH-9555 (trade name), and 2 g of Catalyst RG for the silicone gum, uniformly in 35 ml of a solvent mixture of methyl ethyl ketone and cyclohexane in a 6:1 by volume ratio. The photosensitive composition thus prepared was uniformly coated on the subbing layer formed on the aluminum sheet in an amount of 5 g/1000 cm$^2$ and then immediately heated for 1 minute to 120°C to vulcanize the silicone gums to silicone rubber and to provide a dry presensitized planographic plate of this invention. After 3 months, the dry presensitized planographic plate was exposed as described in Example 1 and developed with n-heptane to provide a printing plate. When printing was conducted using the printing plate thus prepared, 1000 good prints were obtained. The printing plate was not injured or scratched after printing.

EXAMPLE 3

A photosensitive composition was prepared by dissolving 0.15 g of 2,6-bis-(4'-azidobenzal)cyclohexanone, 0.2 g of Saran resin EX-5701, a one-liquid normal-temperature vulcanization type silicone gum, KE-41 RTV, a two-liquid normal-temperature vulcanization type silicone gum, SH-9555 RTV, and Catalyst RG for the silicone gum, in 35 ml of a solvent mixture of methyl ethyl ketone and cyclohexane in a 6:1 volume ratio. The photosensitive composition thus prepared was uniformly coated on the subbing layer formed on the aluminum sheet as used in Example 2 in an amount of 5 g/1000 cm² and immediately heated for 1 hour to 120°C to provide the good dry presensitized planographic plate of this invention.

While the invention has been described in detail and with reference to specific embodiments thereof, it will be apparent to one skilled in the art that various changes and modifications can be made therein without departing from the spirit and scope thereof.

What is claimed is:

1. A dry presensitized positive-working planographic plate comprising a support having an ink receptive surface and having coated thereon one or two layers of (a) a silicone gum selected from the group consisting of a single package-type silicone gum, a two package-type silicone gum and a mixture thereof, (b) a photosensitive azide compound, (c) a cyclized rubber, and (d) a copolymer of vinylidene chloride and acrylonitrile wherein the molar ratio of vinylidene chloride:acrylonitrile is about 70:30 to 91:9, the uppermost layer, when said planographic plate has two layers, containing at least said components (a) and (b) and the lower layer containing at least said component (c), said components (a), (b), (c) and (d) being in a homogeneous mixture when present in a single layer, and said componets (a), (b) and (d) being present in a homogeneous mixture when present in a single layer, and said components (a) and (b) being present in a homogeneous mixture when present in a single layer, said single package-type silicone gum being a linear compound having repeating units of the following formula:

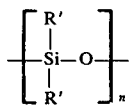

n = 2 – 2000 wherein R′, which can be the same or different, is a monovalent alkyl group, a monovalent aryl group or a cyanoaryl group, said linear compound being terminated by acetyl, oxime, alkyl or amino groups said two package-type silicone gum being a condensation type or an addition type silicone gum, said two package addition reaction type silicone gum being formed from the following reaction (A)

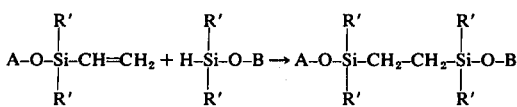

or the following reaction (B)

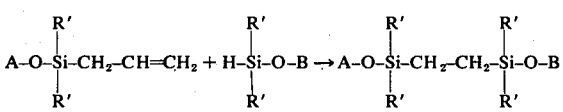

wherein A and B represent organosiloxane residues and R′ is a monovalent alkyl group, a monovalent aryl group or a cyanoaryl group; and the two package-type silicone condensation type gum being formed by the following reaction scheme

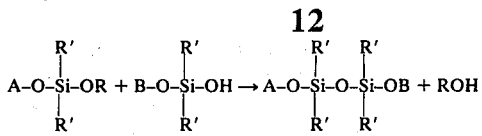

wherein R′, A, and B are as defined in this claim and R is a 1 to 3 carbon alkyl group, in the case of (a), (b), (c) and (d) being in a single layer, the amounts of (a), (b), (c) and (d) corresponding to the application of a coating at a rate of 3 to 10 g/1000 cm² of a mixture prepared by dissolving uniformly in 200 to 400 parts by weight of a solvent 1 to 5 parts by weight of a solution prepared by dissolving 3 grams of (c) in 100 ml of a solvent, 1 to 5 parts by weight of (b), 1 to 2 parts by weight of (d) and 10 to 30 parts by weight of (a), in the case of said planographic plate having two layers, (a), (b), (c) and (d) are present in amounts corresponding to applying the following coatings:

A. In the case of a coating of (c) and (d), the application of 1 to 4 g/1000 cm² of a mixture of 90 to 95 parts by weight of a solution of (c) and 10 to 15 parts by weight of a solution of (d);

B. In the case of a coating of (b) and (a), 3 to 10 g/1000 cm² of a mixture of 2 to 5 parts by weight of (b), 2 to 10 parts by weight of a single package-type silicone gum (a) and 15 to 30 parts by weight of a two package-type silicone gum (a) in 300 to 400 parts by weight of solvent;

C. In the case of coating containing (a) and (b) and (d), the above formulation B further containing 1 to 3 parts by weight of (d), said silicone gum being vulcanized into silicone rubber after application to said support.

2. The dry presensitized planographic plate as set forth in claim 1, in which said photosensitive azide compound is 2,6-dichloro-4-nitro-azidobenzene, azidophenylamine, 3,3′-dimethoxy-4,4′-diazidodiphenyl, 4′-methoxy-4-azidophenylamine, 4,4′-diazidophenylamine, 4,4′-diazidodiphenylmethane, 4′-nitrophenylazobenzene-4-azide, 1-azidopyrene, 3,3′-dimethyl-4,4′-diazidophenyl 4,4′-diazidophenylazonaphthalene, p-phenylene-bisazide, p-azidobenzophenone, 4,4′-diazidobenzophenone, 4,4′-diazidophenylmethane, 4,4′-diazidostilbene, 4,4′-diazidocalcon, 2,6-di-(4′-azidobenzal)cyclohexanone, or 2,6-di-(4′-azidobenzal)-4-methylcyclohexanone.

3. The dry presensitized planographic plate of claim 1 wherein the molar ratio of vinylidene chloride:acrylonitrile is about 80:20.

4. The dry presensitized planographic plate of claim 1 wherein less than 2–3 molar percent of the R′ groups are vinyl phenyl, halovinyl or phenyl.

5. The dry presensitized planographic plate of claim 4 wherein R′ is methyl.

6. The dry presensitized planographic plate of claim 4 wherein said single package-type silicone gum contains one of the following terminal groups:

$$(RO)_2-\underset{\underset{R'}{|}}{\overset{\underset{}{}}{Si}}-O-$$

where R is an alkyl group having 1 to 3 carbon atoms,

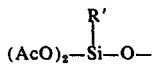

wherein Ac is an acetyl group

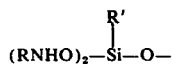

where R is an alkyl group having 1 to 3 carbon atoms
or

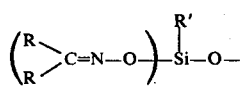

wherein R is an alkyl group having 1 to 3 carbon atoms.

7. The dry presensitized planographic plate of claim 1 wherein R' is selected from 1–3 carbon atom alkyl groups.

8. A process for producing a dry presensitized positive-working planographic plate which comprises applying to a support having an ink receptive surface a coating of one or two layers of (a) a silicone gum selected from the group consisting of a single package-type silicone gum, a two package-type silicone gum and a mixture thereof, (b) a photosensitive azide compound, (c) a cyclized rubber, and (d) a copolymer of vinylidene chloride and acrylonitrile wherein the molar ratio of vinylidene chloride:acrylonitrile is abour 70:30 to 91:9, the uppermost layer, when said planographic plate has two layers, containing at least said components (a) and (b) and the lower layer containing at least said component (c), said components (a), (b), (c) and (d) being in a homogeneous mixture when present in a single layer, and said components (a), (b) and (d) being present in a homogeneous mixture when present in a single layer, and said components (a) and (b) being present in a homogeneous mixture when present in a single layer, said single package-type silicone gum being a linear compound having repeating units of the following formula:

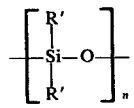

n = 2 – 2000 wherein R', which can be the same or different, is a monovalent alkyl group, a monovalent aryl group or a cyanoaryl group, said linear compound being terminated by acetyl, oxime, alkyl or amino groups, said two package-type silicone gum being a condensation type or an addition type silicone gum, said two package addition reaction type silicone gum being formed from the following reaction (A)

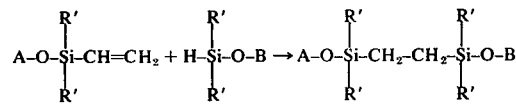

or the following reaction (B)

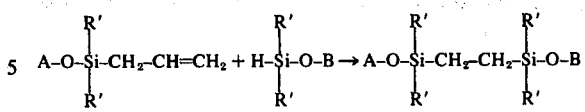

wherein A and B represent organosiloxane residues and R' is a monovalent alkyl group, a monovalent aryl group or a cyanoaryl group; and the two package-type silicone condensation type gum being formed by the following reaction scheme

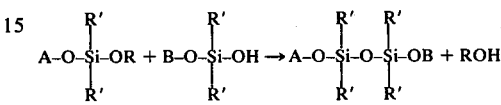

wherein R', A, and B are as defined in this claim and R is a 1 to 3 carbon alkyl group, in the case of (a), (b), (c) and (d) being in a single layer, the amounts of (a), (b), (c) and (d) corresponding to the application of a coating at a rate of 3 to 10 g/1000 cm$^2$ of a mixture prepared by dissolving uniformly in 200 to 400 parts by weight of a solvent 1 to 5 parts by weight of a solution prepared by dissolving 3 grams of (c) in 100 ml of a solvent, 1 to 5 parts by weight of (b), 1 to 2 parts by weight of (d) and 10 to 30 parts by weight of (a), in the case of said planographic plate having two layers, (a), (b), (c) and (d) are present in amounts corresponding to applying the following coatings:

A. In the case of a coating of (c) and (d), the application of 1 to 4 g/1000 cm$^2$ of a mixture of 90 to 95 parts by weight of a solution of (c) and 10 to 5 parts by weight of a solution of (d);

B. In the case of a coating of (b) and (a), 3 to 10 g/1000 cm$^2$ of a mixture of 2 to 5 parts by weight of (b), 2 to 10 parts by weight of a single package-type silicone gum (a) and 15 to 30 parts by weight of a two package-type silicone gum (a) in 300 to 400 parts by weight of solvent;

C. In the case of a coating containing (a) and (b) and (d), the above formulation B further containing 1 to 3 parts by weight of (d), and vulcanizing said silicone gum into silicone rubber.

9. The process of claim 8 wherein said photosensitive azide compound is 2,6-dichloro-4-nitro-azidobenzene, azidophenylamine, 3,3'-dimethoxy-4,4'-diazidodiphenyl, 4'-methoxy-4-azidophenylamine, 4,4'-diazidophenylamine, 4,4'-diazidodiphenylmethane, 4'-nitrophenylazobenzene-4-azide, 1-azidopyrene, 3,3'-dimethyl-4,4'-diazidophenyl, 4,4'-diazidophenylazonaphthalene, p-phenylene-bisazide, p-azidobenzophenone, 4,4'-diazidobenzophenone, 4,4'-diazidophenylmethane, 4,4'-diazidostilbene, 4,4'-diazidocalcon, 2,6'di-(4'-azidobenzal)cyclohexanone, or 2,6-di-(4'-azidobenzal)-4-methylcyclohexanone.

10. The process of claim 8 wherein the molar ratio of vinylidene chloride:acrylonitrile is about 80:20.

11. The process of claim 8 wherein less than 2–3 molar percent of the R' groups are vinyl phenyl, halovinyl or phenyl.

12. The process of claim 8 wherein R' is methyl.

13. The process of claim 8 wherein said single package-type silicone gum contains one of the following terminal groups:
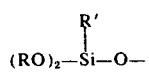
where R is an alkyl group having 1 to 3 carbon atoms,
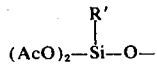
wherein Ac is an acetyl group
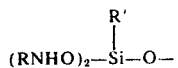
where R is an alkyl group having 1 to 3 carbon atoms or
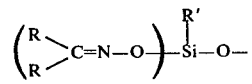
where R is an alkyl group having 1 to 3 carbon atoms,
14. The process of claim 8 wherein R' is selected from 1-3 carbon atom alkyl groups.
* * * * *